United States Patent
El Hallak et al.

(10) Patent No.: US 11,328,744 B1
(45) Date of Patent: May 10, 2022

(54) ON-WAFER INTEGRATED LASER FOR HEAT-ASSISTED MAGNETIC RECORDING

(71) Applicant: Seagate Technology LLC, Fremont, CA (US)

(72) Inventors: Fadi El Hallak, Londonderry (GB); Michael Gerald Boyle, Belfast (GB); Paula Frances McElhinney, Londonderry (GB); Marcus Benedict Mooney, Donegal (IE); Aidan Dominic Goggin, Donegal (IE); Cillian Macdara OBriain Fallon, Malahide (IE)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/162,182

(22) Filed: Jan. 29, 2021

(51) Int. Cl.
| | |
|---|---|
| *G11B 11/105* | (2006.01) |
| *G11B 5/48* | (2006.01) |
| *G11B 5/31* | (2006.01) |
| *H01S 3/063* | (2006.01) |
| *G11B 5/60* | (2006.01) |
| *G11B 5/00* | (2006.01) |

(52) U.S. Cl.
CPC ............ *G11B 5/4866* (2013.01); *G11B 5/314* (2013.01); *G11B 5/6088* (2013.01); *H01S 3/063* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 7,622,367 B1 | 11/2009 | Nuzzo et al. | |
| 8,456,969 B1* | 6/2013 | Mooney | G11B 5/314 369/13.33 |
| 8,498,182 B1* | 7/2013 | Balamane | G11B 5/314 369/13.33 |
| 9,019,661 B2 | 4/2015 | Rea et al. | |
| 9,799,359 B1* | 10/2017 | Olson | G11B 5/6088 |
| 10,069,029 B1* | 9/2018 | Olson | G11B 5/1272 |
| 10,692,525 B2* | 6/2020 | Goggin | G11B 7/126 |
| 10,861,489 B1* | 12/2020 | Habibi | H01S 5/02469 |
| 10,971,179 B1* | 4/2021 | Mehfuz | G11B 5/314 |
| 2008/0225920 A1* | 9/2008 | Nakashima | H01S 5/0207 372/44.01 |
| 2010/0296537 A1* | 11/2010 | Kotani | G11B 7/122 372/43.01 |
| 2014/0209664 A1* | 7/2014 | Takayama | G11B 5/105 228/104 |
| 2016/0133288 A1* | 5/2016 | Zhao | C23C 14/5806 369/13.33 |
| 2017/0287513 A1* | 10/2017 | Shimazawa | G11B 5/187 |
| 2018/0211685 A1* | 7/2018 | Mehfuz | G02B 6/125 |

OTHER PUBLICATIONS

Kuran, "Magnetic Self-Assembly with Unique Rotational Alignment", Jan. 2015, 136 pages.

* cited by examiner

*Primary Examiner* — Tan X Dinh (74) *Attorney, Agent, or Firm* — Mueting Raasch Group (57) ABSTRACT

An apparatus comprises a substrate. A laser is deposited above the substrate. The laser includes one or more non-self-supporting layers of crystalline material. A metallic adhesive is disposed between the laser and the substrate. The metallic adhesive is configured to adhere the laser to the substrate. A waveguide is deposited proximate the laser. The waveguide is configured to receive light from the laser and direct the light to a recording medium.

20 Claims, 10 Drawing Sheets

ON-WAFER INTEGRATED LASER FOR HEAT-ASSISTED MAGNETIC RECORDING

SUMMARY

Embodiments described herein involve an apparatus comprising a substrate. A laser is deposited above the substrate. The laser comprises one or more non-self-supporting layers of crystalline material. A metallic adhesive is disposed between the laser and the substrate. The metallic adhesive is configured to adhere the laser to the substrate. A waveguide is deposited proximate the laser. The waveguide is configured to receive light from the laser and direct the light to a recording medium.

Embodiments involve an apparatus comprising a substrate. A laser is deposited above the substrate. The laser comprises one or more non-self-supporting layers of crystalline material. A metallic adhesive is disposed between the laser and the substrate. The metallic adhesive is configured to adhere the laser to the substrate. At least one anisotropic magnetic structure is disposed proximate the laser. The waveguide is configured to receive light from the laser and direct the light to a recording medium.

A method involves depositing a metallic adhesive on a substrate. A laser diode unit is transfer printed over the metallic adhesive. At least one anisotropic magnetic structure is deposited proximate the laser. Heat sufficient to melt the metallic adhesive is applied. A magnetic field is applied to the at least one anisotropic structure at a time when the heat is being applied. The applied heat and the magnetic field are configured to align the laser diode on the substrate. A waveguide core is deposited over the laser diode unit. The thermally conductive underlayer is configured to provide thermal coupling between the laser diode unit and the substrate and to sink heat away from the laser diode unit.

BRIEF DESCRIPTION OF THE DRAWINGS

Throughout the specification, reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure relates to read/write heads used in heat-assisted magnetic recording (HAMR), also referred to as thermally-assisted recording (TAR), thermally-assisted magnetic recording (TAMR), energy-assisted magnetic recording (EAMR), etc. In this disclosure the terms "read/write head," "slider," and "head" will be used interchangeably. In a HAMR device, a read/write head includes an energy source (e.g., a laser diode) that heats a recording medium during writing. The HAMR read/write head generally includes some form of optical transmission path, such as a waveguide and near-field transducer, that shapes and directs the energy from the energy source to the recording medium.

In some implementations, the read/write head and laser diode are formed using separate processes, aligned using a surface-mount placement process (e.g., pick and place), and bonded together (e.g., using solder). While this type of assembly process is well-established for assembly of electronic components, there are challenges in mass-assembly of HAMR read/write heads using these processes.

According to embodiments described herein, the space on a slider is very limited. When adding printed structures such as lasers and/or reader amplifier on the slider, heat sinking may be performed to sink heat away from the slider components. In general, the laser and/or other slider structures are fabricated on a heat sink disposed on a portion of a surface of the substrate of the slider. The heat sink may have one or more layers of highly thermally conductive materials configured to conduct heat away from the laser diode and/or other structures and use the substrate as a heat sink. In some cases, the heat sink may provide bonding for various transfer printed structures in the recording head. Properties of heat sink layer and/or layers adjacent to the laser diode may be chosen to match a coefficient of thermal expansion and/or other property of the laser diode to facilitate bonding of the laser diode and/or other slider structures to the substrate. The substrate may comprise a material (e.g., AlTiC) with a limited thermal conductivity. For example, the thermal conductivity of the substrate may be about 20 W/m·K.

According to embodiments described herein, an underlayer of a highly thermally conductive material may be disposed between the substrate and the heat sink and may be deposited before building any of the first layers of the slider. The underlayer may comprise Cu with a thermal conductivity of about 200 W/mK. For example, the underlayer may comprise Cu with a thermal conductivity of about 200 W/mK. Adding the highly thermally conductive underlayer allows added heat sinking without disrupting the build order, move features, or increase reader/writer separation.

In the present disclosure, hard drive recording heads are used onto which at least part of a semiconductor laser (e.g., crystalline, epitaxial layer) is not self-supporting (e.g., not a separately packaged device) but is physically carried by same substrate that carries the other components of the read/write head (e.g., write coil and poles, reader stack) without the use of a separate or intermediate support during attachment. Carrying the semiconductor laser with the read/write head substrate, without a separate or intermediate support substrate, can help to reduce the size and weight of the head, and it can also allow for the use of laser geometries and designs that are very different from simple edge-emitting cleaved facet lasers that have been proposed in the past.

A thermally conductive underlayer may be provided that is configured to reduce the temperature of the laser diode and various surrounding structures. The underlayer may also be used to provide good thermal coupling between the laser diode and the substrate and other surrounding components of the hard drive recording head.

In at least some cases, parts of the laser (e.g., GaAs active region) are incompatible with epitaxial growth on the substrate. As such, the laser cannot be formed using the same layer deposition processes used to form the magnetic and optical components that are integrated into the head. In embodiments described below, the laser may instead be formed on the substrate by transfer printing a thin, non-self-supporting crystalline layer (epitaxial layer), or a stack of such layers, from a growth substrate on which they were formed to a target substrate. Thereafter, the epitaxial layer and substrate are further processed (e.g., masked etched, further layers added) to form the slider-integral laser.

This process of transferring non-self-supporting layers of epitaxial-growth-incompatible layers is referred to herein as On-Wafer Laser (OWL) process integration. This process may also be referred to as transfer printing, dry transfer printing, nanoprinting, etc. In FIGS. 1-5, block diagrams illustrate transfer printing of components onto a recording head according to an example embodiment.

Figures 1, 2, 3, 4, 5:
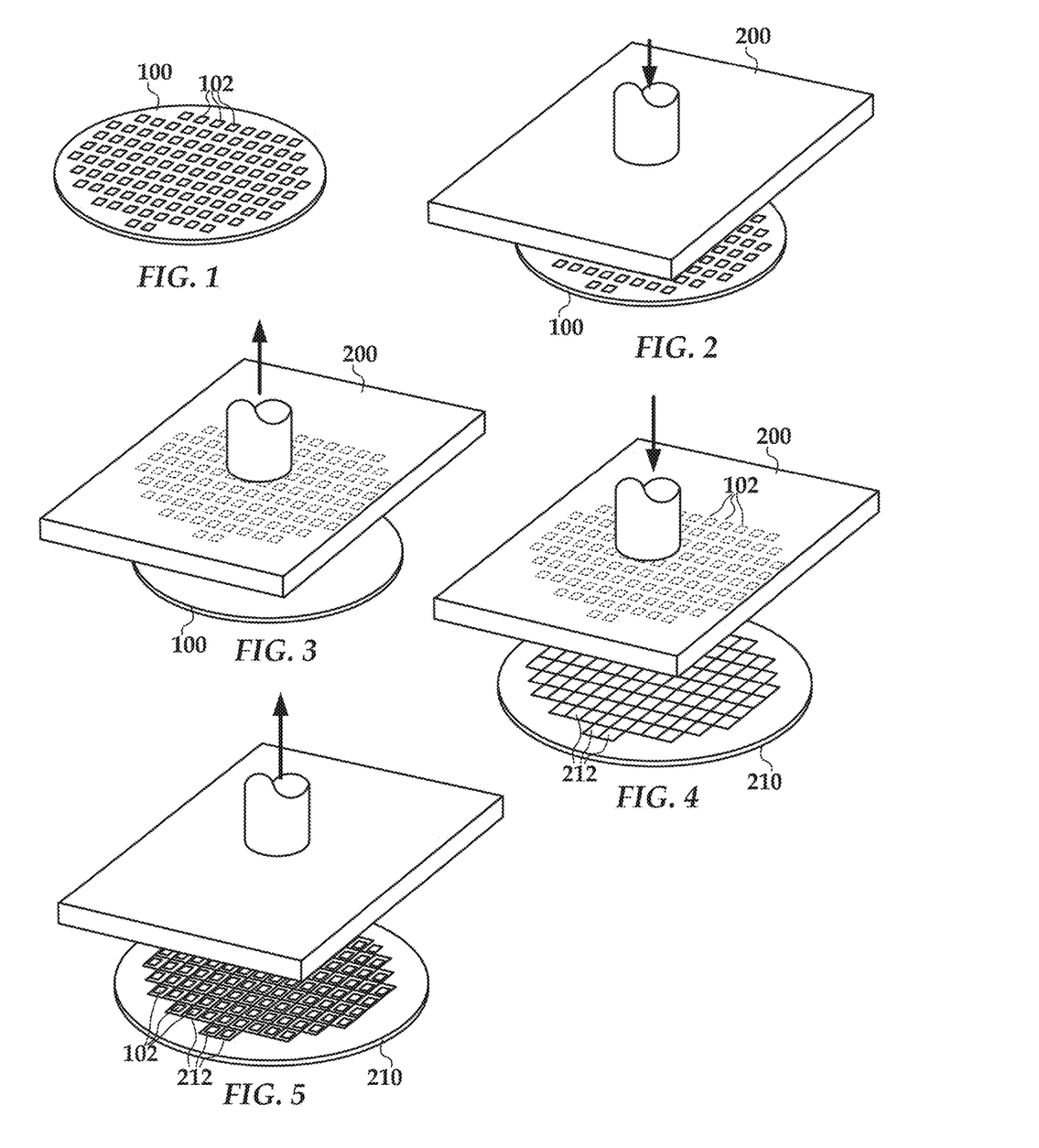
FIGS. 1-5 are diagrams showing a transfer printing process in accordance with embodiments described herein.

In FIG. 1, a donor substrate 100 includes a number of components 102 (e.g., epitaxial layers) formed using a first process (e.g., crystalline growth). The components 102 may include one or more layers of materials that have been processed via photolithography and/or other processes to attain a final shape and position on the substrate 100. A sacrificial layer may also be included between the components 102 and the substrate 100 to allow separation. This fabrication could include some or all of the following: epitaxial material layer, adhesion or protection layers, carrier layers (to increase thickness for easier transport), bonding layers to aid in best print transfer, and integration layers to enable subsequent integration (e.g., stop features to allow planarization after integration).

As seen in FIG. 2, a transfer print head 200 is lowered onto the substrate material (or material stack) onto a target substrate (typically of a different material). The transfer print head 200 is lifted as shown in FIG. 3, taking the components 102 with it. In this way, "islands" of the component material are then transferred to a target substrate 210 as shown in FIGS. 4-5.

As seen in FIG. 4, the transfer print head 200 is lowered over a wafer 210 that includes a number of partially-processed recording heads 212. The transfer print head 200 presses the components 102 on to the wafer 210 and is then pulled away as seen in FIG. 5. This attaches the components 102 to the recording heads 212. Afterwards, the wafer 210 is further processed, e.g., etching the components 102 to final shape and alignment, and depositing additional layers of material to form the remaining recording head components.

Figure 6:
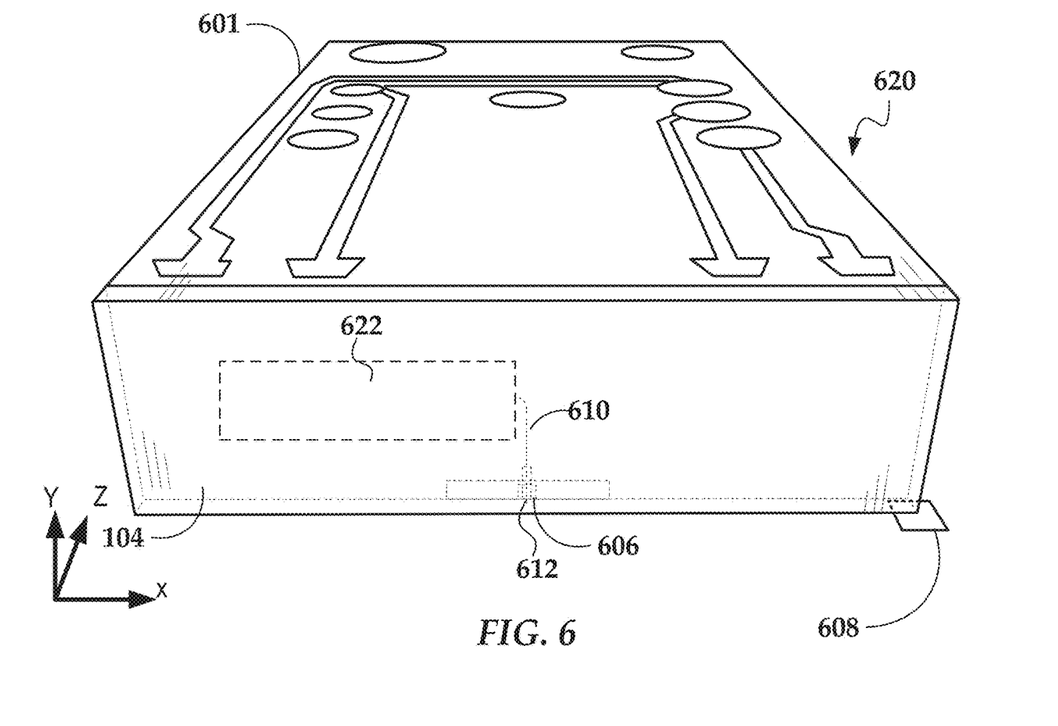
FIG. 6 is a perspective view of a slider having an On-Wafer Laser (OWL) in accordance with embodiments described herein.

FIG. 6 shows a perspective view of a HAMR write head 620 in accordance with embodiments described herein. As described above, at least part of the laser diode 622 is not self-supporting (e.g., not a separately packaged device) but is physically transferred to a target read/write head substrate that does contain already or will contain, after further processing, the other components of the read/write head (e.g., write coil and poles, reader stack) without the use of a separate or intermediate support during attachment. The laser diode 622 delivers light to a region proximate a HAMR read/write transducer 606, which is located near the media-facing surface 608. The media-facing surface 608 faces and is held proximate to the moving media surface while reading and writing to the media. The media-facing surface 108 may be configured as an air-bearing surface (ABS) that maintains separation from the media surface via a thin layer of air.

The energy is used to heat the recording media as it passes by the read/write transducer 606. Optical coupling components, such as a waveguide system 610, are formed integrally within the slider body 601 (near a trailing edge surface in this example) and function as an optical path that delivers energy from the laser diode 622 to the recording media via a near-field transducer 612. The near-field transducer 612 is located near the read/write transducer 606 and causes heating of the media during recording operations. The near-field transducer 612 may be made from plasmonic materials such as gold, silver, copper, etc.

Figure 7A:
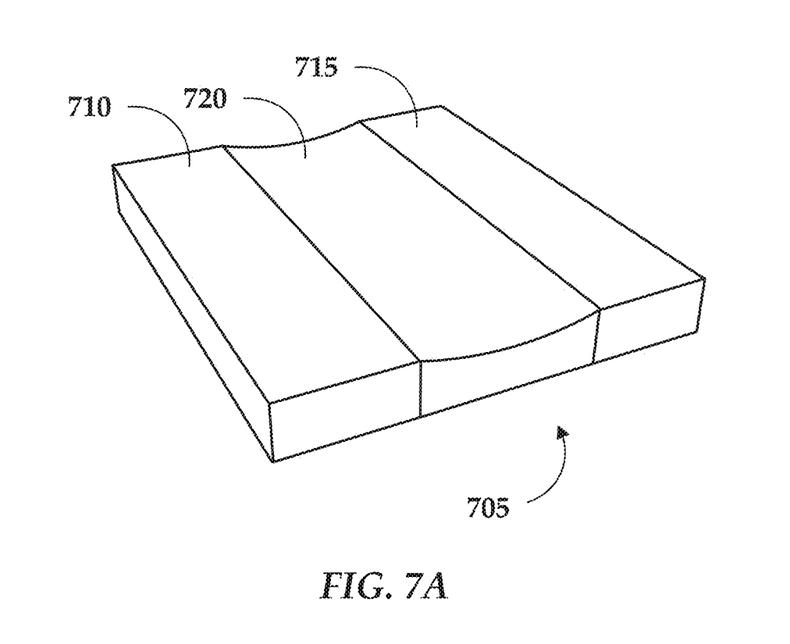
FIG. 7A shows a substrate for transfer printing a laser in accordance with embodiments described herein.

FIG. 7A shows a substrate for transfer printing a laser. The substrate 705 has a first portion 710, a second portion 715, and a third portion 720 between the first portion 710 and the second portion 715. According to various configurations, a laser is configured to be printed over the third portion 720. One or more of the substrate portions 710, 715, 720 may serve as a heat sink for the laser. In some embodiments, the third substrate portion 720 serves as a heat sink for the laser. In some cases, one or more of the substrate portions 710, 715, 720 comprises a different material than at least one other portion.

According to various embodiments described herein, the third portion 720 may have an indentation. The indentation may be caused by imperfections caused by the manufacturing process, for example The indentation may be curved. For example, the indentation may be have a curve having a concave shape as shown in FIG. 7A. It is to be understood that the indentation may have any shape.

Figure 7B:
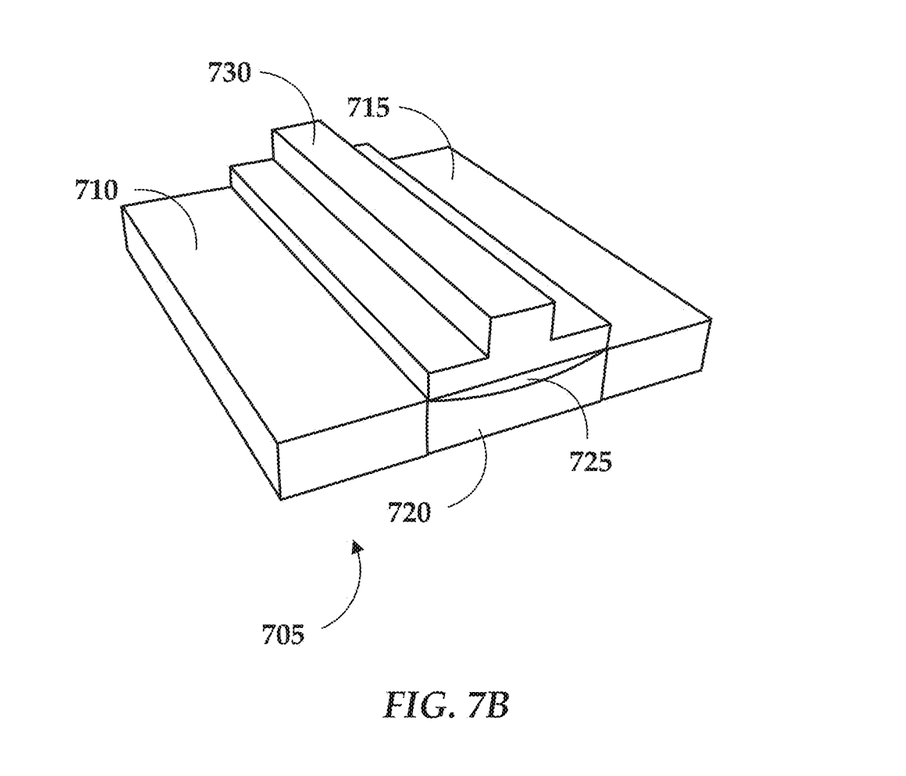
FIG. 7B shows a view of a laser that has been transfer printed over the third substrate portion in accordance with embodiments described herein.
Figure 7C:
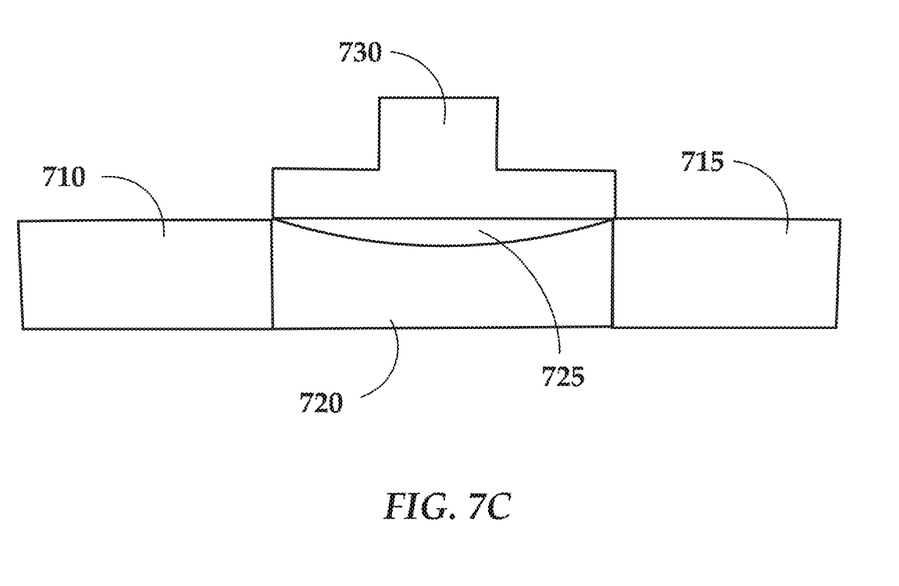
FIG. 7C shows a different view of the laser, the substrate portions, and the gap in accordance with embodiments described herein.

FIG. 7B shows a view of a laser 730 that has been transfer printed over the third substrate portion 720. A gap 725 may be formed between the laser 730 and the third portion of the substrate 720. The gap 725 may cause poor physical contact between the bottom of the laser and the substrate. The poor physical contact may result in poor heat sinking. According to various configurations, the gap 725 is reflective of imperfections in the laser heat sink. For example, the gap 725 may be caused by an over-polish and/or under-polish process, roughness, and/or defects. FIG. 7C shows a different view of the laser 730, the substrate portions 710, 715, and 720, and the gap 725 in accordance with embodiments described herein.

An adhesive, e.g., a conformal adhesive, of suitable thickness may be used to enhance the contact between the laser and the heat sink. Using thick adhesives may cause a decrease in thermal conductivity between the laser and the heat sink. According to various embodiments described herein, a metallic layer may be disposed between the laser and the substrate. Using metallic layers with a suitable melting point can enable better heat sinking of the laser leading to better performance over conventional adhesives.

Figure 8A:
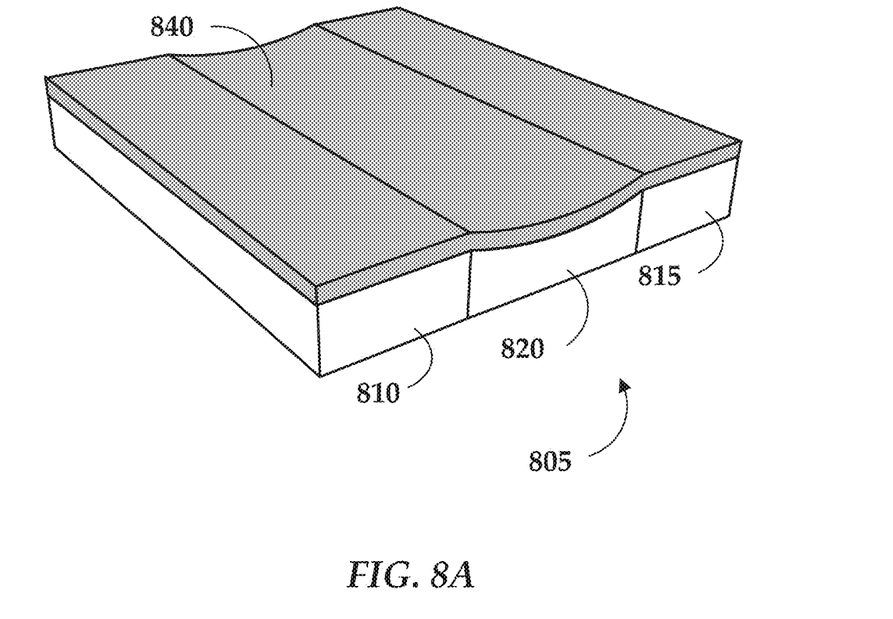
FIGS. 8A-8C show examples of a transfer printed laser having a metallic adhesive disposed between the laser and the substrate in accordance with embodiments described herein.
Figure 8B:
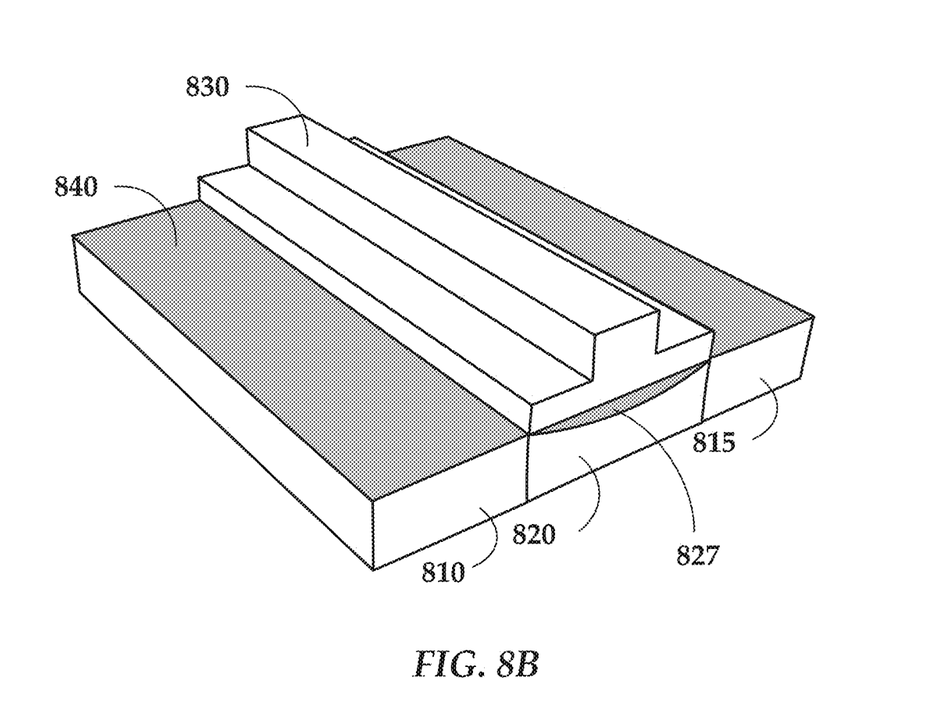
Figure 8C:
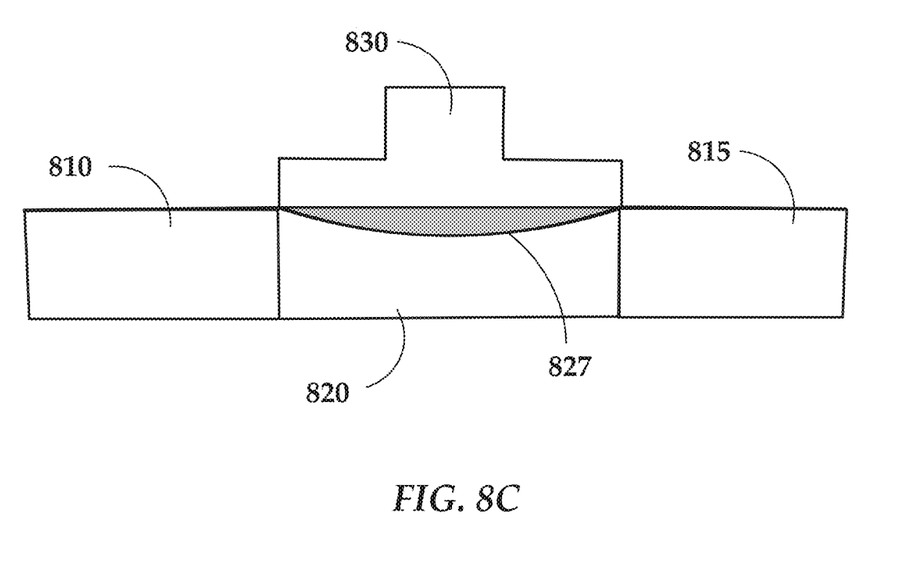

FIGS. 8A-8C show examples of a transfer printed laser having a metallic adhesive disposed between the laser and the substrate in accordance with embodiments described herein. The substrate 805 has a first portion 810, a second portion 815, and a third portion 820 between the first portion and the second portion. According to various configurations, a laser 830 is configured to be printed over the third portion 820.

A metallic adhesive 840 is deposited over the substrate portions 810, 815, 820. In some cases, the metallic adhesive is deposited as a continuous sheet across an entire surface of the substrate between the substrate 805 and the laser 830. The metallic adhesive 840 may only be deposited on a portion of the surface of the substrate 805. For example, the metallic adhesive 840 may only be deposited on a surface of the third portion 820 of the substrate 805. As can be observed in FIG. 8B, the gap 827 formed between the laser 830 and the third substrate portion 820 comprises the metallic adhesive.

The metallic adhesive may comprise any metallic material with a suitable melting point. According to various configurations, the metallic material may have a melting point that is low enough to enable adhesion but high enough not to melt under laser operation. For example, the metallic adhesive may comprise any metallic material having a melting point in a range of about 110 degrees C. to about 300 degrees C. In some cases, the metallic adhesive may comprise any metallic material having a melting point in a range of about 180 degrees C. to about 210 degrees C. The metallic adhesive may comprise one or more of AuSn, InAg, InSn, SnAgCu, SnAg, SnCu, SnZnCu, InAg, for example. According to various configurations, heat sufficient to melt the metallic adhesive is applied to allow the laser to be aligned with the substrate.

According to various configurations, application of heat and/or one or more magnetic fields may be used to align the laser with the substrate. To facilitate this process, one or more anisotropic strips may be disposed on or near the laser. FIGS. 9A-9D show examples of a laser having anisotropic strips in accordance with embodiments described herein.

Figure 9A:
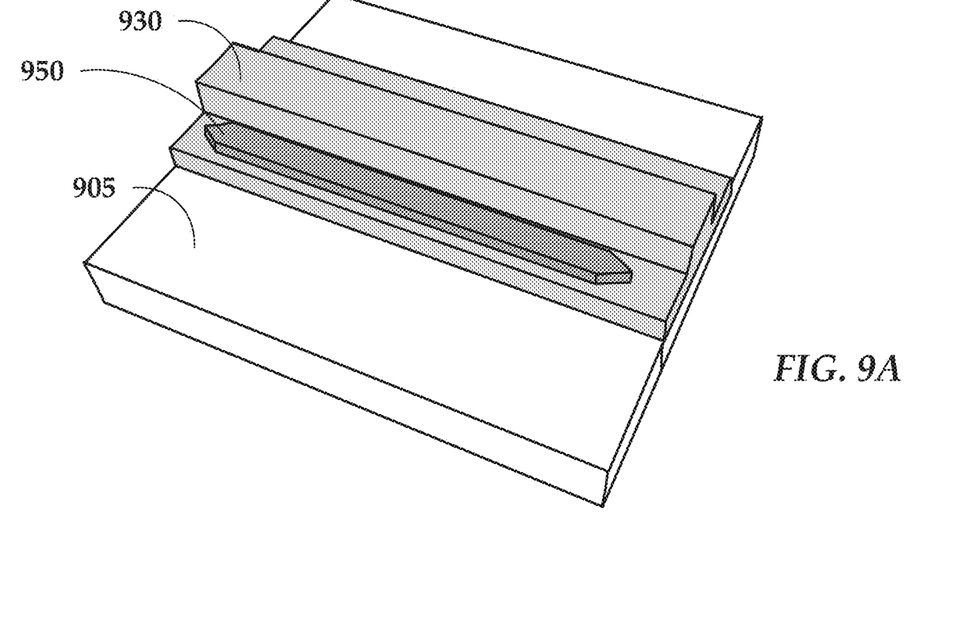
FIGS. 9A-9D show examples of a laser having anisotropic strips in accordance with embodiments described herein.
Figure 9B:
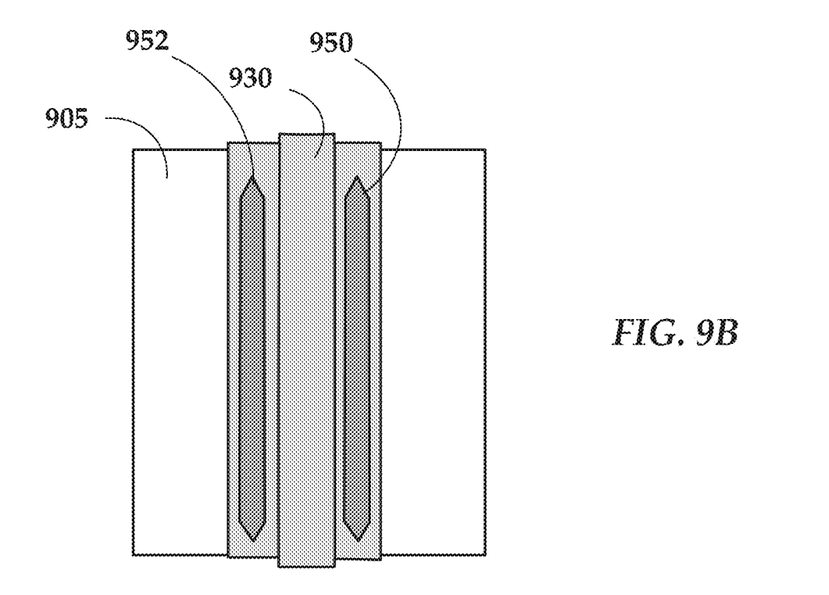

FIG. 9A shows a substrate 905 and a laser 930 transfer printed over the substrate 905. A metallic adhesive may be disposed between the laser 930 and the substrate 905. A highly anisotropic magnetic structure 950 is disposed on the laser 930. According to various configurations, there is more than one highly anisotropic structure 950, 952 disposed on the laser 930 as shown in FIG. 9B. The highly anisotropic magnetic structure may comprise one or more of various Fe, Ni, Co, Pt alloys, for example Heat may be applied at a temperature that melts the metallic adhesive.

Figure 9C:
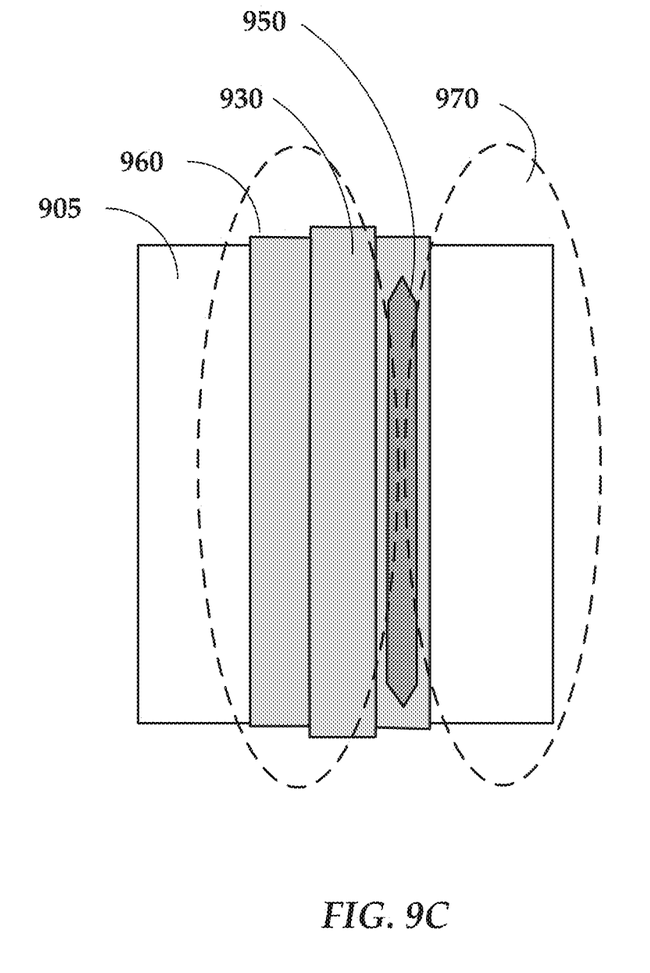

A magnetic field 960 may be applied as shown in FIG. 9C. According to various configurations, the magnetic field is an external magnetic field with high moment. The application of the magnetic field and the melted adhesive causes the laser to align to a defined direction by the magnetic field. The torque generated by the external magnetic field allows the laser to rotate when the metallic adhesive is heated up. According to various configurations, the device is cooled down so that the metallic adhesive hardens while the magnetic field is still being applied. This allows the laser 930 to stay aligned after the adhesive has hardened. According to various configurations, the precision for laser alignment is between 0 nm and 100 nm.

Figure 9D:
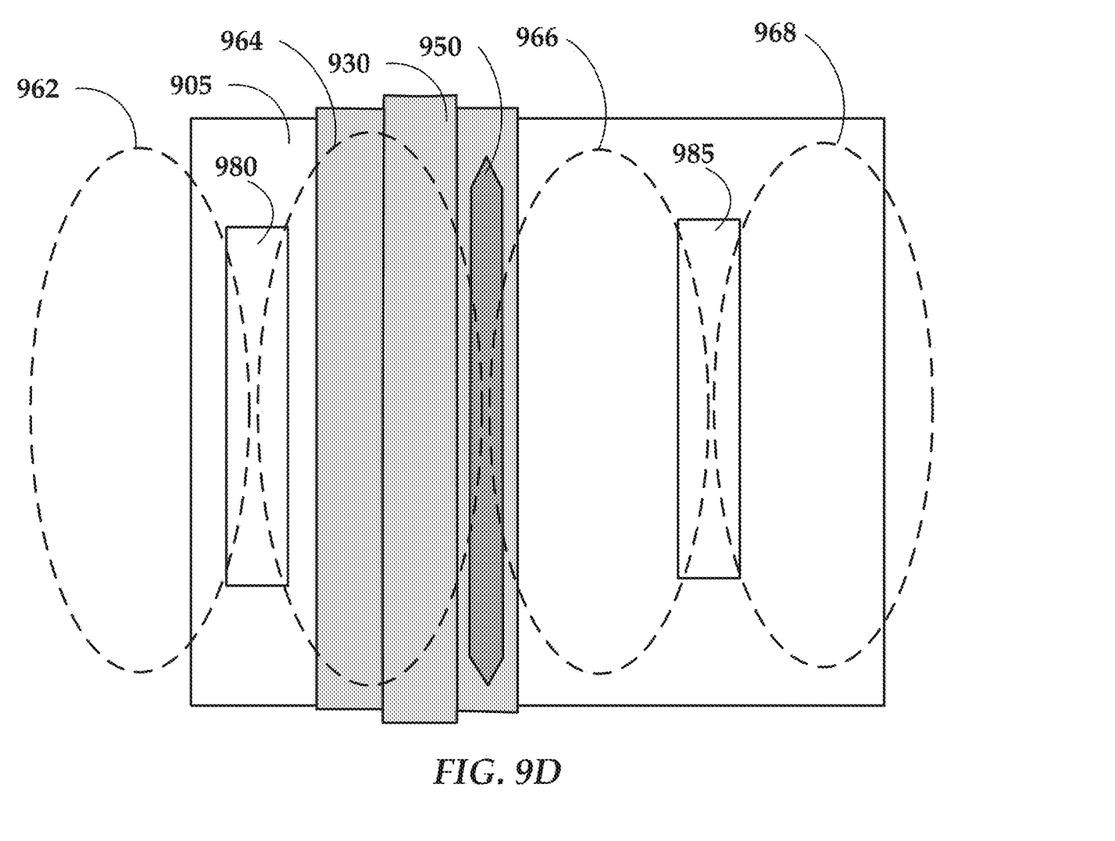

FIG. 9D illustrates another example of using a magnetic field to align a laser to a substrate in accordance with embodiments described herein. One or more magnetic structures 980, 985 are disposed on the substrate 905. The magnetic structures 980, 985 may be used to apply a localized magnetic field 962, 964, 966, 968. The localized field 962, 964, 966, 968 generated by the built-in micro scale magnetic structure may have two purposes. The first purpose is to generate a local field to align the laser in a similar manner to the external field described above thus impacting the angle of the laser. The second is to generate a local field gradient that can be controlled by adjusting the design/shape/material of 980, 985. The laser will move on the surface to sit at the lowest potential which may be determined by the external gradient thus aligning the laser in x, y direction and not only by its angle.

Figure 10:
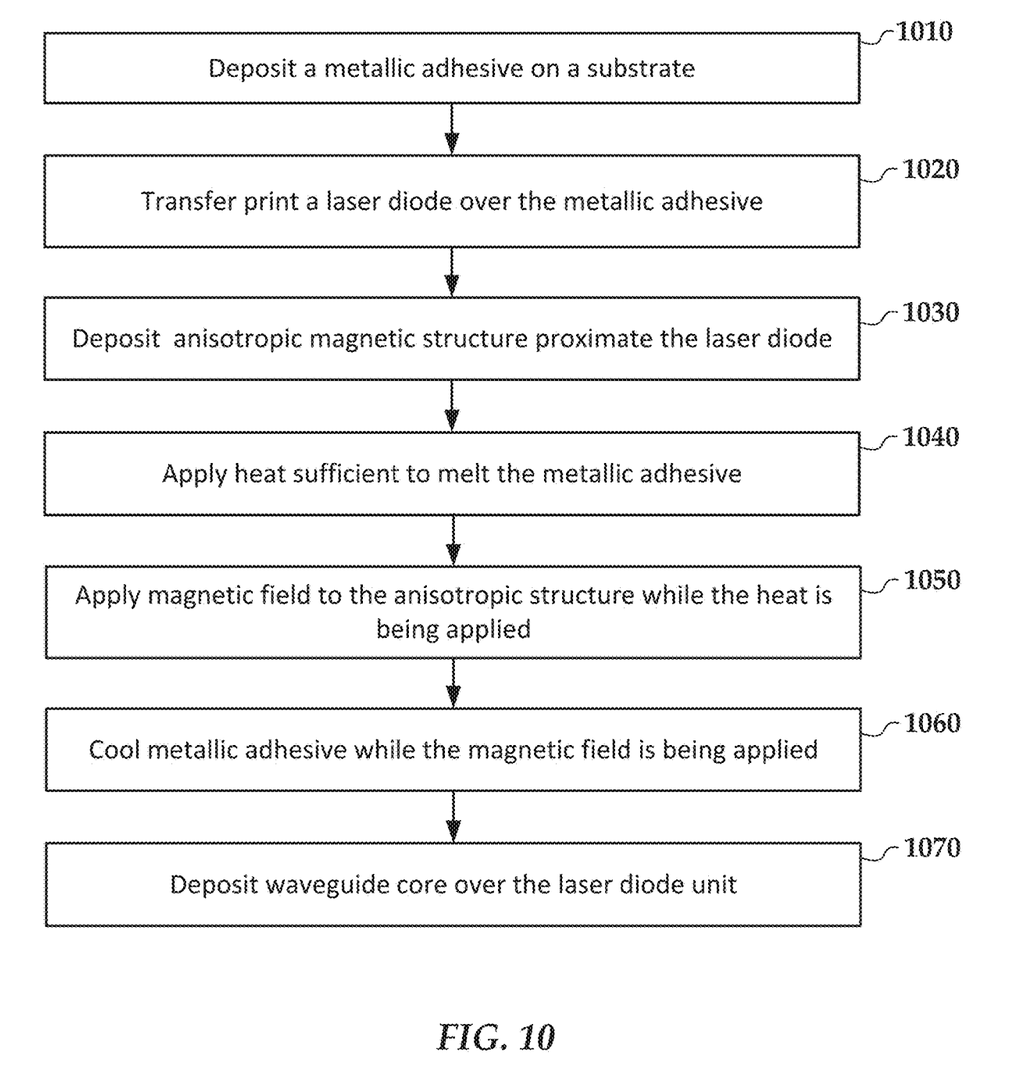
FIG. 10 illustrates a method of making a system for aligning a laser with a substrate in accordance with embodiments described herein.

FIG. 10 illustrates a method of making a system for aligning a laser with a substrate in accordance with embodiments described herein. A metallic adhesive is deposited 1010 on at least a portion of a laser-facing surface of the substrate. In some cases, the metallic adhesive is deposited along the entire laser-facing surface of the substrate.

A laser diode is transfer-printed 1020 over the metallic adhesive. An anisotropic magnetic structure is deposited 1030 proximate the laser diode. In some cases, the anisotropic magnetic structure is deposited on the laser diode.

Heat sufficient to melt the metallic adhesive is applied 1040. A magnetic field is applied 1050 to the anisotropic structure while the heat is being applied 1040. The metallic adhesive is cooled 1060 while the magnetic field is being applied 1050. A waveguide core is deposited 1070 over the laser diode unit.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. An apparatus comprising:
   a substrate;
   a laser deposited above the substrate, the laser comprising one or more non-self-supporting layers of crystalline material;
   a metallic adhesive disposed between the laser and the substrate, the metallic adhesive configured to adhere the laser to the substrate and to facilitate alignment of the laser on the substrate; and
   a waveguide deposited proximate the laser, the waveguide configured to receive light from the laser and direct the light to a recording medium.

2. The apparatus of claim 1, further comprising at least one anisotropic magnetic structure disposed proximate the laser, the at least one anisotropic magnetic structure configured to align the laser on the substrate when a magnetic field is applied.

3. The apparatus of claim 2, wherein the anisotropic magnetic structure is configured to align the laser on the substrate when heat is applied.

4. The apparatus of claim 2, wherein the anisotropic magnetic structure comprises one or more of Fe, Ni, Co, and Pt alloys.

5. The apparatus of claim 1, wherein the metallic adhesive is disposed along an entire surface of the substrate.

6. The apparatus of claim 1, wherein the metallic adhesive comprises one or more of AuSn, InAg, InSn, SnAgCu, SnAg, SnCu, SnZnCu, and InAg.

7. The apparatus of claim 1, wherein at least a portion of the substrate is configured to act as a heat sink of the laser.

8. The apparatus of claim 1, wherein the metallic adhesive has a melting point in a range of about 180 degrees C. to about 210 degrees C.

9. An apparatus comprising:
a substrate;
a laser deposited above the substrate, the laser comprising one or more non-self-supporting layers of crystalline material;
a metallic adhesive disposed between the laser and the substrate, the metallic adhesive configured to adhere the laser to the substrate;
at least one anisotropic magnetic structure disposed proximate the laser; and
a waveguide deposited proximate the laser, the waveguide configured to receive light from the laser and direct the light to a recording medium.

10. The apparatus of claim 9, wherein the at least one anisotropic magnetic structure is configured to align the laser on the substrate when a magnetic field is applied.

11. The apparatus of claim 9, wherein the anisotropic magnetic structure comprises one or more of Fe, Ni, Co, and Pt alloys.

12. The apparatus of claim 9, wherein the metallic adhesive is disposed along an entire surface of the substrate.

13. The apparatus of claim 9, wherein the metallic adhesive comprises one or more of AuSn, InAg, InSn, SnAgCu, SnAg, SnCu, SnZnCu, and InAg.

14. The apparatus of claim 9, wherein at least a portion of the substrate is configured to act as a heat sink of the laser.

15. The apparatus of claim 9, wherein the metallic adhesive has a melting point in a range of about 180 degrees C. to about 210 degrees C.

16. A method, comprising:
depositing a metallic adhesive on a substrate;
transfer printing a laser diode unit over the metallic adhesive;
depositing at least one anisotropic magnetic structure proximate the laser;
applying heat sufficient to melt the metallic adhesive;
applying a magnetic field to the at least one anisotropic structure at a time when the heat is being applied, the applied heat and the magnetic field configured to align the laser diode on the substrate; and
depositing a waveguide core over the laser diode unit, wherein the thermally conductive underlayer is configured to provide thermal coupling between the laser diode unit and the substrate and to sink heat away from the laser diode unit.

17. The method of claim 16, wherein the metallic adhesive comprises one or more of AuSn, InAg, InSn, SnAgCu, SnAg, SnCu, SnZnCu, InAg.

18. The method of claim 16, wherein depositing a metallic adhesive on the substrate comprises depositing a continuous sheet disposed directly on substantially an entire first surface the substrate.

19. The method of claim 16, wherein applying heat sufficient to melt the metallic adhesive comprises applying heat of a temperature in a range of about 180 degrees C. to about 210 degrees C.

20. The method of claim 16, further comprising, after applying heat to the metallic substrate, cooling down the metallic substrate while applying the magnetic field.

* * * * *

UNITED STATES PATENT AND TRADEMARK OFFICE
CERTIFICATE OF CORRECTION

PATENT NO. : 11,328,744 B1
APPLICATION NO. : 17/162182
DATED : May 10, 2022
INVENTOR(S) : Fadi El Hallak et al.

Page 1 of 1

It is certified that error appears in the above-identified patent and that said Letters Patent is hereby corrected as shown below:

In the Claims

Column 8 In Claim 17 Line 22, 'InAg' should be -- and InAg --.

Column 8 In Claim 18 Line 26, 'the' should be -- of the --.

Signed and Sealed this
Fourth Day of July, 2023

Katherine Kelly Vidal
*Director of the United States Patent and Trademark Office*